(12) United States Patent
Yoon et al.

(10) Patent No.: US 8,445,305 B2
(45) Date of Patent: May 21, 2013

(54) METHOD FOR MANUFACTURING 3-DIMENSIONAL STRUCTURES USING THIN FILM WITH COLUMNAR NANO PORES AND MANUFACTURE THEREOF

(75) Inventors: Jun-Bo Yoon, Daejeon (KR); Byung-Kee Lee, Daejeon (KR); Dong-Hoon Choi, Daejeon (KR); Hyun-Ho Yang, Daejeon (KR)

(73) Assignee: Korea Advanced Institute of Science and Technology (KR)

( * ) Notice: Subject to any disclaimer, the term of this patent is extended or adjusted under 35 U.S.C. 154(b) by 0 days.

(21) Appl. No.: 12/992,555

(22) PCT Filed: May 28, 2010

(86) PCT No.: PCT/KR2010/003396
§ 371 (c)(1),
(2), (4) Date: Jan. 24, 2011

(87) PCT Pub. No.: WO2010/140792
PCT Pub. Date: Dec. 9, 2010

(65) Prior Publication Data
US 2011/0233737 A1 Sep. 29, 2011

(30) Foreign Application Priority Data
Jun. 2, 2009 (KR) .................. 10-2009-0048662

(51) Int. Cl.
*H01L 23/053* (2006.01)
*H01L 21/311* (2006.01)

(52) U.S. Cl.
USPC ........................................... 438/51

(58) Field of Classification Search ............... 438/51, 438/127, FOR. 438; 257/E21.501
See application file for complete search history.

(56) References Cited

U.S. PATENT DOCUMENTS

| | | | |
|---|---|---|---|
| 6,287,979 B1 * | 9/2001 | Zhou et al. | 438/723 |
| 6,753,270 B1 * | 6/2004 | Geiger et al. | 438/780 |
| 6,777,347 B1 * | 8/2004 | Ni et al. | 438/771 |
| 2004/0212028 A1 * | 10/2004 | Dougherty | 257/415 |
| 2004/0248376 A1 * | 12/2004 | Kiihamaki | 438/456 |
| 2006/0273065 A1 * | 12/2006 | Kim et al. | 216/2 |
| 2006/0281295 A1 * | 12/2006 | Naujok et al. | 438/618 |
| 2008/0135998 A1 * | 6/2008 | Witvrouw et al. | 257/678 |
| 2009/0140626 A1 * | 6/2009 | Kim et al. | 313/306 |

(Continued)

OTHER PUBLICATIONS

Verheijden, G. J. A. M., et al, "Wafer Level Encapsulation Technology for MEMS Devices Using an HF-Permeable PECVD SIOC Capping Layer", IEEE, MEMS 2008, Tucson AZ, Jan. 13-17, 2008, pp. 798-801.*

*Primary Examiner* — George Fourson, III
(74) *Attorney, Agent, or Firm* — The Belles Group, P.C.

(57) ABSTRACT

Disclosed is a method for manufacturing 3-dimensional structure using a thin film with a columnar nano pores and a manufacture thereof. A method for packaging an MEMS device or an NEMS device in accordance with an embodiment of the present invention includes: forming a sacrificial layer; forming a thin film having columnar nano pores formed therein by depositing one of a metallic material, an oxide, a nitride and a fluoride on the sacrificial layer; forming a support layer on the thin film and patterning the support layer; removing the sacrificial layer through use of the nano pores of the thin film parts of which are exposed by patterning the support layer; and forming a shielding layer on the thin film and the support layer.

11 Claims, 5 Drawing Sheets

U.S. PATENT DOCUMENTS

2009/0237980 A1* 9/2009 Kim et al. ............... 365/149
2009/0243063 A1* 10/2009 Yoon et al. ............... 257/678
2009/0267166 A1* 10/2009 Verheijden et al. ........... 257/415
2010/0003790 A1* 1/2010 Kronmueller et al. ........ 438/127

* cited by examiner

METHOD FOR MANUFACTURING 3-DIMENSIONAL STRUCTURES USING THIN FILM WITH COLUMNAR NANO PORES AND MANUFACTURE THEREOF

CROSS-REFERENCE TO RELATED PATENT APPLICATIONS

The present application is a U.S. national stage application under 35 U.S.C. §371 of PCT Application No. PCT/KR2010/003396, filed May 28, 2010, which claims priority to Korean Patent Application No. 10-2009-0048662, filed Jun. 2, 2009, the entireties of which are incorporated herein by reference.

TECHNICAL FIELD

The present invention relates to a method for manufacturing 3-dimensional structure using a thin film with a columnar nano pores and a manufacture thereof.

BACKGROUND ART

A Method for Packaging a Micro or Nano Electro-mechanical System Device

A conventional method for packaging a micro electro mechanical system (MEMS) device or a nano electro mechanical system (NEMS) device is performed as follows. First, after an MEMS device or an NEMS device is manufactured on a substrate, a sacrificial layer is formed to cover the device. Then, a thin film layer for removing the sacrificial layer is formed on the sacrificial layer. Subsequently, an etching hole is formed in the thin film layer, and then the sacrificial layer is removed through the etching hole. The sacrificial layer can be removed by using a wet etching process or a dry etching process. Next, a shielding layer is formed to surround the thin film layer so that the device is packaged.

Such a packaging method needs a process of forming the etching hole in the thin film layer in order to remove the sacrificial layer. Here, the etching hole is formed in a position adjacent to the edge of the device. In this case, there are problems in that it takes a large amount of time to remove the sacrificial layer and in that the device may be damaged physically or chemically.

A Method for Forming a Nano Wire

Among conventional methods for forming a nano wire, there is a method using a template including a vertical nano-sized pore. Here, an etching method and an anodizing method and the like can be used for forming the template.

The etching method is to porously etch a silicon substrate by using an electro-chemical method. The anodizing method is to form a vertical nano-sized pore in metallic material such as Al or Ti and the like.

Said methods are simple and inexpensive compared to a conventional reactive ion etching (RIE) method and the like. However, they require a porous etching process and an anodizing process.

A Method for Forming a Hydrophobic Surface

A conventional method for forming a hydrophobic surface or a super-hydrophobic surface includes a method performed as follows. A micro-sized pattern or a nano-sized pattern is formed, and then another pattern is made of polymer such as Polydimethylsiloxane (PDMS) and the like by using a replica method.

A top down method or a bottom up method and the like is used for forming a micro-sized pattern or a nano-sized pattern.

The top down method includes a templating process, photolithography and a plasma process and the like. The bottom up method includes a chemical vapor deposition, a colloidal assembly layer-by-layer deposition and a sol-gel method and the like. Such methods require not only an additional patterning process of the template but payment for using expensive processes such as the photolithography, an electron beam photolithography or a nano imprint and the like.

DISCLOSURE OF INVENTION

Technical Problem

The objective of the present invention is to provide a method for packaging an MEMS device or NEMS device and provide a package thereof. The method is capable of minimizing both a time required for removing a sacrificial layer and physical damage or chemical damage to the device.

The objective of the present invention is to provide a method for manufacturing a nano wire. The method is capable of making it easier to form the nano wire by using a thin film having a columnar nano pore formed therein without additional nano patterning as a template.

The objective of the present invention is to provide a manufacturing method for a hydrophobic surface. The method is capable of making it easier to form the hydrophobic surface at a low cost.

Solution to Problem

One aspect of this invention includes a method for packaging a micro electro mechanical system (MEMS) device or a nano electro mechanical systems (NEMS) device. The method includes:

forming a sacrificial layer on a substrate having an device formed thereon such that the device is covered with the sacrificial layer;

forming a thin film having columnar nano pores formed therein by depositing one of a metallic material, an oxide, a nitride and a fluoride on the sacrificial layer;

forming a support layer on the thin film and patterning the support layer such that parts of the thin film are exposed;

removing the sacrificial layer through use of the nano pores of the thin film parts of which is exposed by patterning the support layer; and forming a shielding layer on the thin film and the support layer.

The forming a thin film uses one of a physical vapor deposition (PVD) method and a chemical vapor deposition (CVD) method.

The physical vapor deposition method includes one of a sputtering deposition method, a thermal evaporation method or an electron beam evaporation method.

The chemical vapor deposition method includes one of atmosphere CVD (APCVD), low-pressure CVD (LPCVD) and plasma-enhanced CVD (PECVD).

The metallic material includes at least one of Ni, Cr, Co, Fe, Ti, Pt and Al, wherein the oxide includes at least one of indium tin oxide (ITO), ZnO, SiO and $TiO_2$, wherein the nitride includes at least one of TiN, CrN and NbN and wherein the fluoride includes at least one of $CaF_2$ and $MgF_2$.

The support layer and the shielding layer include at least one of a silicon oxide, a silicon nitride and a silicon carbide.

The shielding layer is formed by a polymeric material including at least one of benzocyclobutene (BCB) and polyimide, and wherein the forming the shielding layer includes a coating the thin film 140 and the support layer 150 with the polymeric material under a desired atmosphere; and performing a heat treatment process on the coated polymer material.

Another aspect of this invention includes a method for forming a nano wire. The method includes:

forming a metal catalyst material layer for growing a nano wire material on a substrate;

forming a thin film having columnar nano pores formed therein by depositing one of a metallic material, an oxide and a nitride on the metal catalyst material layer;

depositing the nano wire material on the thin film such that the nano wire material passes through the nano pores formed in the thin film; and forming the nano wire by removing the thin film.

The metal catalyst material layer includes at least one of Pt and Ni.

The forming a thin film uses one of a physical vapor deposition (PVD) method and a chemical vapor deposition (CVD) method.

The physical vapor deposition method includes one of a sputtering deposition method, a thermal evaporation method or an electron beam evaporation method.

The chemical vapor deposition method includes one of atmosphere CVD (APCVD), low-pressure CVD (LPCVD) and plasma-enhanced CVD (PECVD).

The metallic material includes at least one of Ni, Cr, Co, Fe, Ti, Pt and Al, wherein the oxide includes at least one of indium tin oxide (ITO), ZnO, SiO and TiO2, wherein the nitride includes at least one of TiN, CrN and NbN and wherein the fluoride includes at least one of CaF2 and MgF2.

Yet another aspect of this invention includes a method for forming a hydrophobic surface. The method includes:

forming a thin film having columnar nano pores formed therein by depositing one of a metallic material, an oxide, a nitride and a fluoride on a substrate;

applying a polymer on the thin film such that the polymer is introduced into the nano pores formed in the thin film; and forming a polymer having a hydrophobic surface by separating the applied polymer from the thin film.

After the forming the thin film, the method further includes performing a self-assembled monolayer (SAM) coating treatment on the surface of the thin film such that the surface of the thin film becomes hydrophilic.

The forming a thin film uses one of a physical vapor deposition (PVD) method and a chemical vapor deposition (CVD) method.

The physical vapor deposition method includes one of a sputtering deposition method, a thermal evaporation method or an electron beam evaporation method.

The chemical vapor deposition method includes one of atmosphere CVD (APCVD), low-pressure CVD (LPCVD) and plasma-enhanced CVD (PECVD).

The metallic material includes at least one of Ni, Cr, Co, Fe, Ti, Pt and Al, wherein the oxide includes at least one of indium tin oxide (ITO), ZnO, SiO and TiO2, wherein the nitride includes at least one of TiN, CrN and NbN and wherein the fluoride includes at least one of CaF2 and MgF2.

The applying the polymer on the thin film includes performing a spin coating process on the polymer inside a vacuum chamber such that the polymer deposited on the thin film is introduced into the nano pores of the thin film.

Still another aspect of this invention includes a micro electro mechanical system (MEMS) or a nano electro mechanical systems (NEMS) device. The package includes:

an MEMS device or an NEMS device disposed on a substrate;

a thin film which surrounds and is spaced from the MEMS device or the NEMS device and which has columnar nano pores formed therein;

a support layer disposed on the thin film; and a shielding layer disposed to surround the support layer.

The thin film includes one of a metallic material, an oxide, a nitride and a fluoride, wherein the metallic material includes at least one of Ni, Cr, Co, Fe, Ti, Pt and Al, wherein the oxide includes at least one of indium tin oxide (ITO), ZnO, SiO and TiO2, wherein the nitride includes at least one of TiN, CrN and NbN, and wherein the fluoride includes at least one of CaF2 and MgF2.

The support layer and the shielding layer include at least one of a silicon oxide, a silicon nitride and a silicon carbide.

The shielding layer includes at least one of benzocyclobutene (BCB) and polyimide.

Advantageous Effects of Invention

In accordance with the packaging method for the embodiment, it is possible to reduce a time required for removing a sacrificial layer during a packaging process by not using an additional process of forming a separating etching hole for removing the sacrificial layer but by using columnar nano pores generated by depositing a thin film. Also, an device can be minimally damaged physically or chemically in the process of removing the sacrificial layer.

In accordance with a method for forming a nano wire of the embodiment, it is possible to omit a process of forming a nano-sized mold by using a thin film having columnar nano pores formed therein as a mold for forming a nano wire or a nano structure.

In accordance with a method for forming a hydrophobic surface of the embodiment, it is possible to more easily manufacture the hydrophobic surface at a low cost by using a thin film having columnar nano pores formed therein without the use of expensive processes such as the photolithography, an electron beam photolithography or a nano imprint and the like.

BRIEF DESCRIPTION OF DRAWINGS

The embodiment will be described in detail with reference to the following drawings.

MODE FOR THE INVENTION

[A Method for Forming an Device]

Prior to a detailed description of a method for packaging an device, a method for forming an device according to an embodiment of the present invention will be described. Particularly, a detailed description of the method for forming the device will be given taking an example of a method for forming an MEMS switch device or an NEMS switch device.

Figure 1:
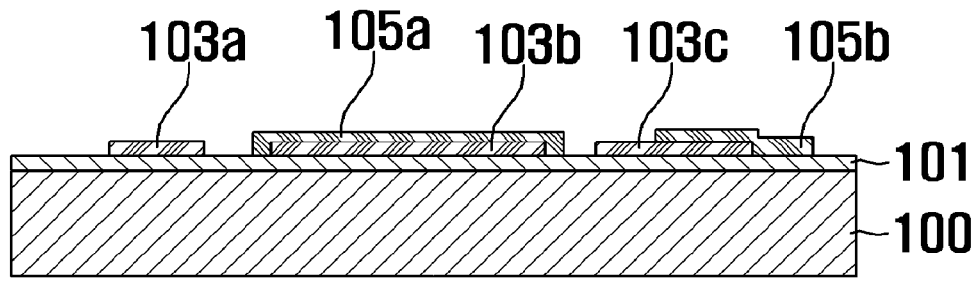
FIGS. 1 to 3 show a method for forming an MEMS device or an NEMS device according to an embodiment of the present invention.
Figure 2:
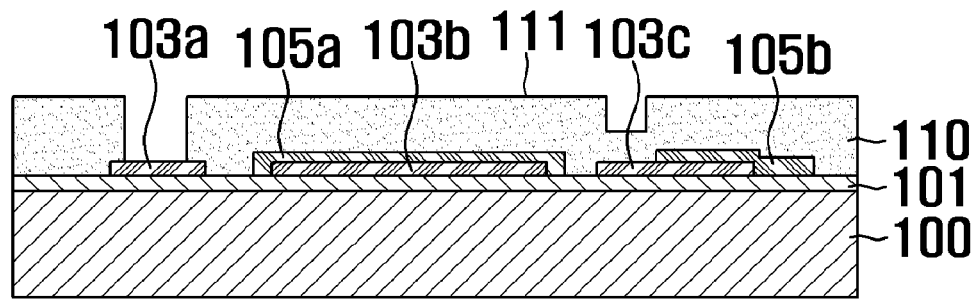
Figure 3:
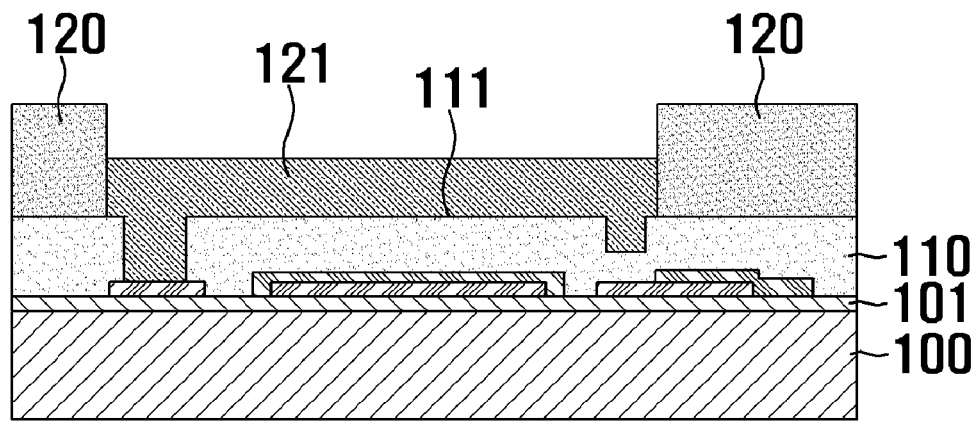

FIGS. 1 to 3 show a method for forming an MEMS switch device or an NEMS switch device according to the present invention.

First, as shown in FIG. 1, a first insulation layer 101 is formed on a substrate 100. The substrate 100 includes a silicon substrate, a glass substrate or a plastic substrate. The first insulation layer 101 is formed by one of a low pressure chemical vapor deposition (LPCVD), plasma enhanced chemical vapor deposition (PECVD) and atmospheric pressure chemical vapor deposition (APCVD). Then, metal electrodes 103a, 103b and 103c of the switch device and second insulation layers 105a and 105b are sequentially formed on the first insulation layer 101.

As shown in FIG. 2, a first sacrificial layer 110 is formed on the first insulation layer 101 and the metal electrodes 103b and 103c. The first sacrificial layer 110 is patterned in order to form a switch beam. Here, the first sacrificial layer is formed by using a sputtering deposition method, a thermal evaporation method, an electron beam evaporation method and the like. A polymer or a metallic material, etc., is used as a material of the first sacrificial layer 110, and it is possible to select a material which is selectively etched with respect to a thin film 140. In the next place, a seed layer 111 for electroplating the switch beam is formed on the patterned first sacrificial layer 110.

As shown in FIG. 3, a switch beam 121 material is deposited by using a photoresist mold 120. Then, the photoresist mold 120 is removed and the seed layer 111 is patterned, so that the switch beam 121 is formed on the substrate 100. The first sacrificial layer 110 is removed during the process of packaging the MEMS device or the NEMS device.

[A Method for Packaging an Device]

Hereinafter, a method for packaging an device according to an embodiment will be described in detail. The device will be described taking an example of aforesaid MEMS device or aforesaid NEMS device.

FIGS. 4 to 10 show a method for packaging an MEMS device or an NEMS device according to the embodiment.

Referring to FIGS. 4 to 10, a method for packaging the MEMS device or the NEMS device according to the embodiment includes a method for forming a sacrificial layer, a method for forming a thin film, a method for forming a support layer, a method for removing the sacrificial layer and a method for forming a shielding layer.

Forming a Sacrificial Layer 130

Figure 4:
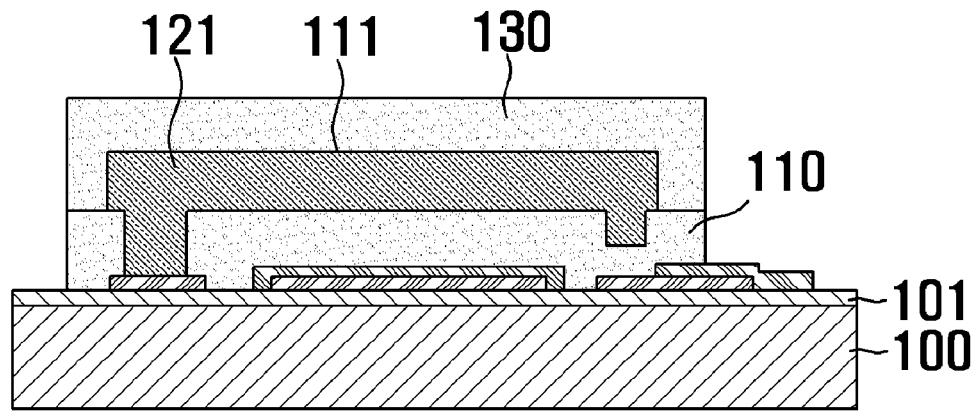
FIGS. 4 to 10 show a method for packaging an MEMS device or an NEMS device according to an embodiment of the present invention.

As shown in FIG. 4, a second sacrificial layer 130 is formed such that the switch device formed on the substrate 100 is completely covered. The method for forming the second sacrificial layer 130 includes a sputtering deposition method, a thermal evaporation method, an electron beam evaporation method and the like. A polymer or a metallic material, etc., is used as a material of the second sacrificial layer 110, and it is desirable to select a material which is selectively etched with respect to the thin film 140. The thickness of the second sacrificial layer 130 is required to be controlled according to the size of the switch device and a spaced distance from a packaged layer. In addition, after the second sacrificial layer 130 is deposited, the first and the second sacrificial layers 110 and 130 are patterned so as to form a cavity for packaging the switch device.

Forming a Thin Film 140

Figure 5:
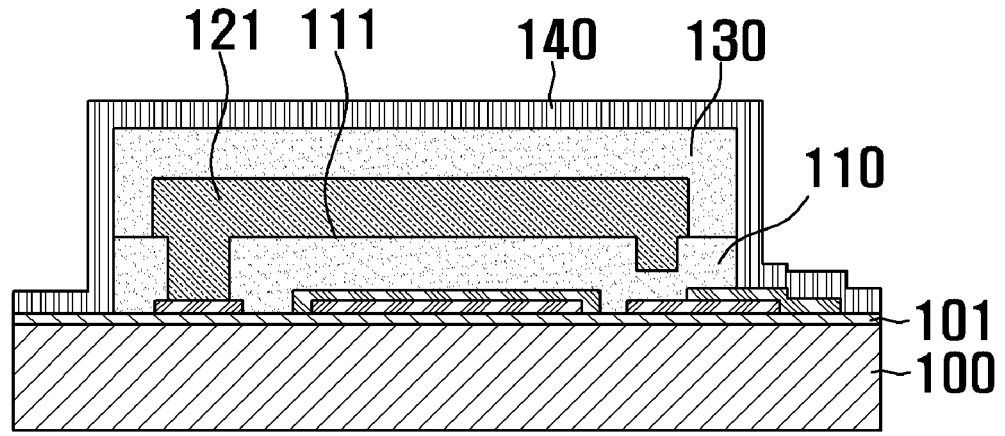

As shown in FIG. 5, the thin film 140 is formed on the first and the second sacrificial layers 110 and 130.

Figure 6:
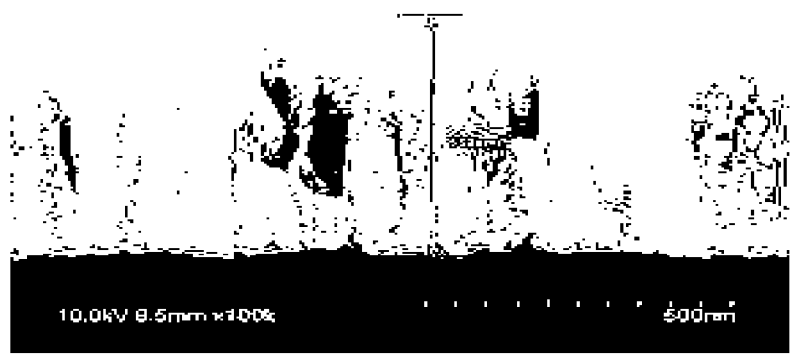

FIG. 6 is an electron microscope photograph showing an enlarged structure of the thin film 140 formed on the first and the second sacrificial layers 110 and 130.

As shown in FIG. 6, the thin film 140 includes vertical nano pores formed therein. Such nano pores have a vertical columnar structure. The thin film 140 is formed of a metallic material, an oxide or a nitride by using a physical vapor deposition (PVD) process or a chemical vapor deposition (CVD) process.

Metallic materials such as Ni, Cr, Co, Fe, Ti, Pt and Al and the like are used for forming the thin film 140. An oxide such as indium tin oxide (ITO), ZnO, SiO and $TiO_2$ is used as a material of the thin film 140. A nitride such as TiN, CrN and NbN is used as a material of the thin film 140. Moreover, $CaF_2$ and $MgF_2$ are also used for forming the thin film 140.

The physical vapor deposition (PVD) process for forming the thin film 140 includes a sputtering deposition method, a thermal evaporation method or an electron beam evaporation method. The chemical vapor deposition (CVD) process includes APCVD, LPCVD or PECVD.

When aforementioned metallic material, oxide, nitride or fluoride is deposited by the physical vapor deposition (PVD) process such as a sputtering deposition or a thermal evaporation, the thin film 140 including the nano pores is formed. A limited surface diffusion and an atomic shadowing effect obtained by not heating the substrate allow the nano pores to form naturally a vertical columnar structure.

When aforementioned metallic material, oxide, nitride or fluoride is deposited by increasing a deposition temperature through the chemical vapor deposition (CVD) process, a preferred orientation in the z-axis direction allows the nano pores to form naturally a vertical columnar structure.

The nano pore can be produced when a deposition material for forming the thin film 140 reaches the substrate 100 and when a surface diffusion does not occur. That is, when the deposition material reaches the substrate 100 and the temperature of the substrate 100 is low (i.e., a normal temperature), the deposition material is not stabilized and immediately grows to have a columnar structure. Therefore, in the case where the deposition material is deposited by use of a sputtering deposition method, a thermal evaporation method or an electron beam evaporation method, the nano pores are formed to have a columnar structure by depositing the material at a normal temperature instead of heating the substrate 100.

In the nano pore, it is possible to adjust porosity of the pore as well as an angle at which the pore is formed due to the atomic shadowing effect according to an incident flux angle at which the deposition material is deposited.

Accordingly, the thin film 140 is formed on the first and the second sacrificial layers 110 and 130 so that an etching hole is formed for the purpose of removing the first and the second sacrificial layers 110 and 130.

Forming a Support Layer 150

Figure 7:
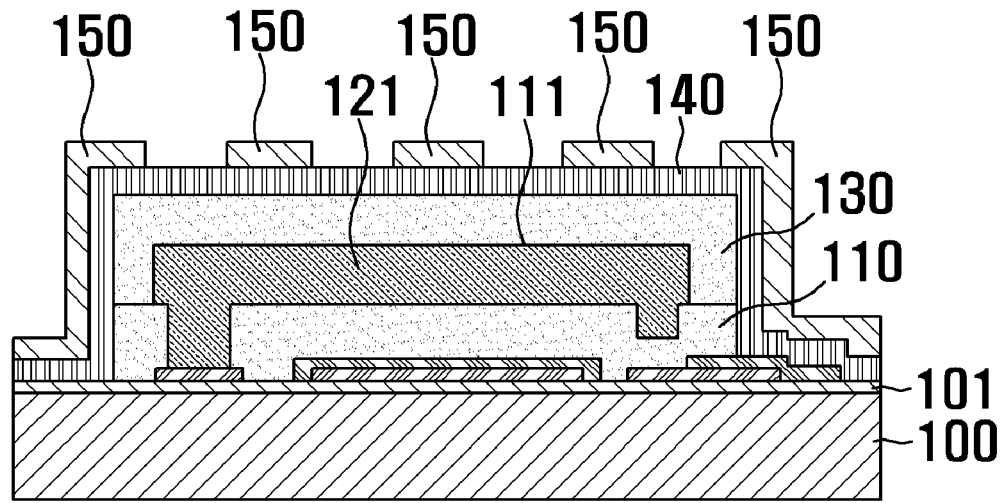

As shown in FIG. 7, a support layer 150 is formed on the thin film 140. The support layer 150 is required to be formed of a material having an excellent mechanical strength so as to improve the structural stability of a package. Therefore, it is desirable to form the support layer 150 by using a material having an excellent mechanical strength, for example, a silicon oxide, a silicon nitride and a silicon carbide.

After the support layer 150 is formed on the thin film 140, the support layer 150 is patterned such that parts of the thin film 140 are exposed. The support layer 150 is patterned in order to remove the first and the second sacrificial layers 110 and 130 by using the exposed nano pore of the thin film 140 by the patterned support layer 150.

Removing the First and the Second Sacrificial Layers 110 and 130

Figure 8:
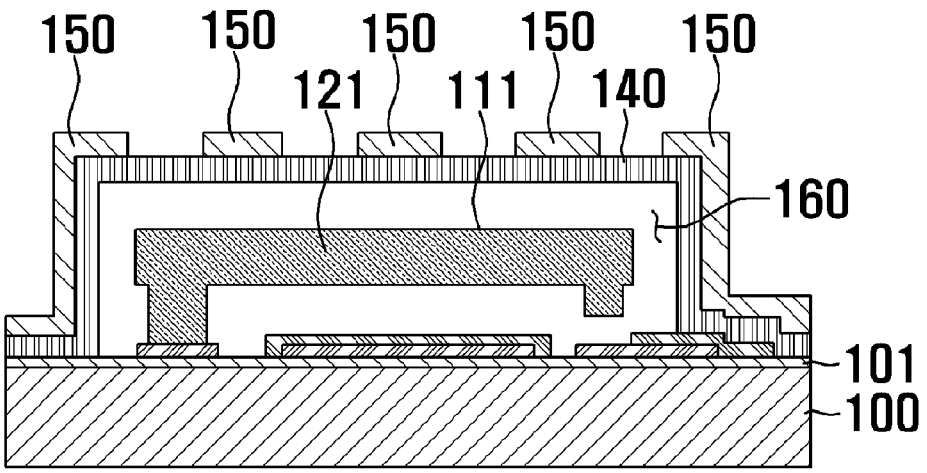

As shown in FIG. 8, a cavity is formed inside the support 150 and the thin film 140 by removing the first and the second sacrificial layers 110 and 130 through use of the nano pores of the thin film 140. A method for removing the sacrificial layer includes a wet etching method or a dry etching method.

Figure 9:
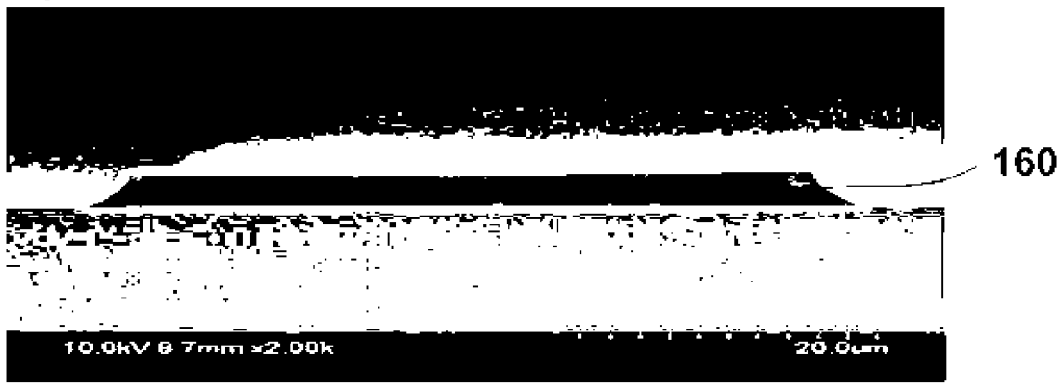

FIG. 9 is an electron microscope photograph showing a cavity 160 actually manufactured. The cavity 160 means an empty space.

Forming a Shielding Layer 170

Figure 10:
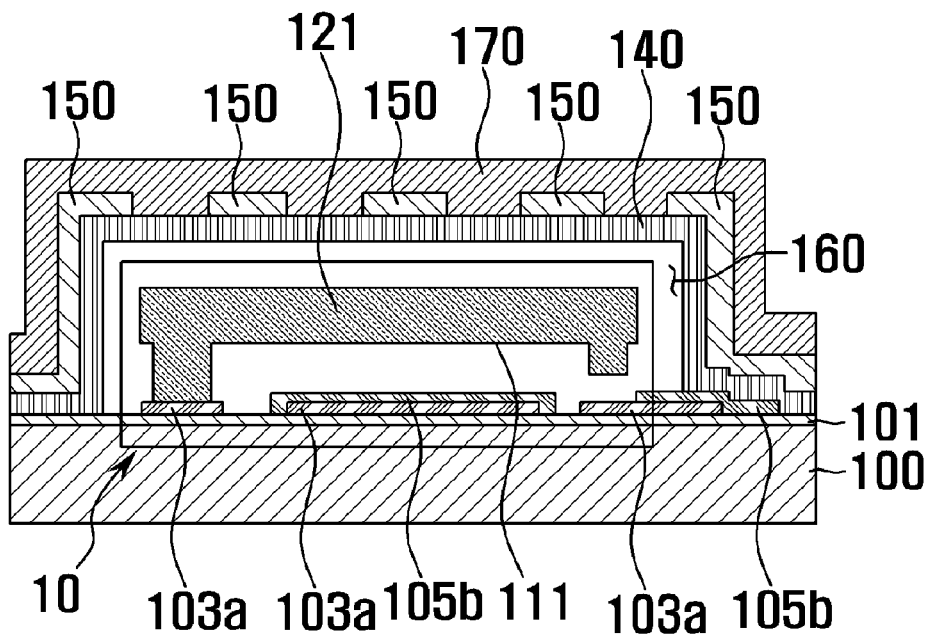

As shown in FIG. 10, a shielding layer 170 is formed on the thin film 140 and the support layer 150.

The shielding layer 170 is required to be formed to include at least one of a silicon oxide, a silicon nitride and a silicon carbide. Since the silicon oxide, silicon nitride and silicon carbide, i.e., constituent materials of the shielding layer 170, have an excellent strength, a package is able to endure the pressure due to an air pressure difference between the inside and outside of the package. Additionally, when the shielding layer 170 is formed by using an ion beam sputter depositing method, other ceramic materials other than the silicon carbide can be used.

In order to perform a packaging process under the controlled atmosphere, the shielding layer 170 is formed by using a polymeric material such as benzocyclobutene (BCB) and polyimide. In this case, after the polymeric material is coated on the thin film 140 and the support layer 150 under the desired atmosphere, the shielding layer 170 is formed by a heat treatment process. Here, if the viscosity of the polymeric material is sufficiently increased, the polymeric material is able to pass through the nano pores formed in the thin film 140 when coating the thin film and the support layer. As a result, it is possible to better prevent factors having a bad influence on the MEMS device or the NEMS device.

According to the embodiment, it is possible to reduce a time required for removing the sacrificial layer during the packaging process by not using an additional process of forming a separating etching hole for removing the sacrificial layer but by using the nano pores generated by depositing the thin film.

[A Package]

FIG. 10 shows a package according to the embodiment.

Referring to FIG. 10, the package according to the embodiment includes an MEMS device 10 or an NEMS device 10, the thin film 140, the support layer 150 and the shielding layer 170.

The MEMS device 10 or the NEMS device 10 is formed on the substrate 100.

On the substrate 100, the thin film 140 is spaced from and surrounds the MEMS device 10 or the NEMS device 10. The thin film 140 includes nano pores having a columnar structure. The thin film 140 is formed to include one of a metallic material, an oxide, a nitride and a fluoride. Here, the metallic material includes at least one of Ni, Cr, Co, Fe, Ti, Pt and Al. The oxide includes at least one of indium tin oxide (ITO), ZnO, SiO and $TiO_2$. The nitride includes at least one of TiN, CrN and NbN. The fluoride includes at least one of $CaF_2$ and $MgF_2$. The support layer 150 is formed on the thin film 140.

The support layer 150 is required to be formed of a material having an excellent mechanical strength so as to improve the structural stability of the package of the MEMS device or the NEMS device. Therefore, the support layer 150 is required to be formed to include at least one of a silicon oxide, a silicon nitride and a silicon carbide.

The shielding layer 170 is formed to surround the support layer 150. The shielding layer 170 is formed to include at least one of the silicon oxide, silicon nitride and silicon carbide. Since the silicon oxide, silicon nitride and silicon carbide, i.e., constituent materials of the shielding layer 170, have an excellent strength, a package is able to endure the pressure due to an air pressure difference between the inside and outside of the package. When a packaging process is performed under a certain atmosphere, the shielding layer 170 is formed to include at least one of benzocyclobutene (BCB) and polyimide.

[A Method for Forming a Nano Wire]

FIGS. 11 to 15 show a method for forming a nano wire according to the embodiment.

Referring to FIGS. 11 to 15, a method for forming a nano wire according to the present invention includes forming a metal catalyst material layer, forming a thin film, depositing a nano wire material and forming a nano wire.

Forming a Metal Catalyst Material Layer

Figure 11:
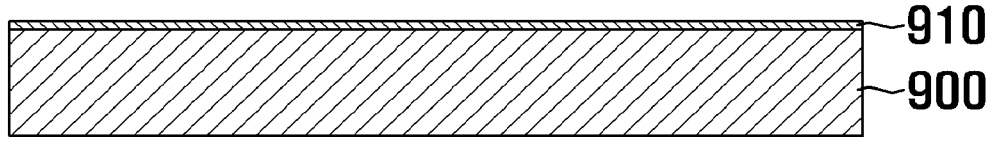
FIGS. 11 to 15 show a method for forming a nano wire according to an embodiment of the present invention.

As shown in FIG. 11, a metal catalyst material layer 910 for growing a carbon nano tube is formed on a substrate 900. Pt and Ni can be used as a constituent material of the metal catalyst material layer 910.

Forming a Thin Film

Figure 12:
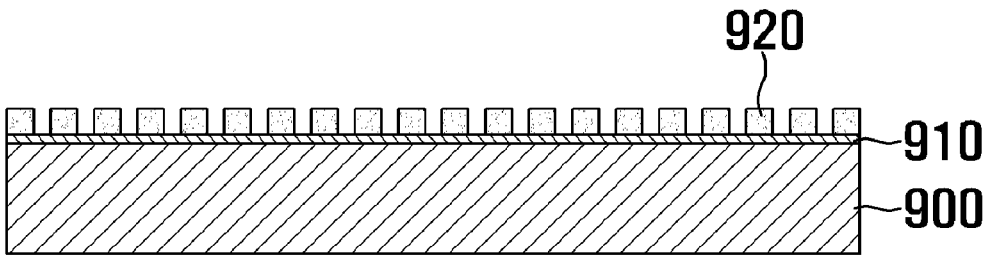

As shown in FIG. 12, a thin film 920 is formed on the metal catalyst material layer 910. The thin film 920 includes vertical nano pores formed therein. The nano pores have a columnar structure. The thin film 920 is formed of a metallic material, an oxide, a nitride and a fluoride by applying a physical vapor deposition or a chemical vapor deposition.

Metallic materials such as Ni, Cr, Co, Fe, Ti, Pt and Al and the like are used for forming the thin film 920. An oxide such as indium tin oxide (ITO), ZnO, SiO and $TiO_2$ is used as a material of the thin film 140. A nitride such as TiN, CrN and NbN is used as a material of the thin film 140. Moreover, $CaF_2$ and $MgF_2$ are also used for forming the thin film 140.

The physical vapor deposition (PVD) process for forming the thin film 920 includes a sputtering deposition method, a thermal evaporation method or an electron beam evaporation method. The chemical vapor deposition (CVD) process includes APCVD, LPCVD or PECVD.

When aforementioned metallic material, oxide, nitride or fluoride is deposited by the physical vapor deposition (PVD) process such as a sputtering deposition or a thermal evaporation, the thin film 920 including the nano pores is formed. A limited surface diffusion and an atomic shadowing effect obtained by not heating the substrate allow the nano pores to form naturally a vertical columnar structure.

When aforementioned metallic material, oxide, nitride or fluoride is deposited by increasing a deposition temperature through the chemical vapor deposition (CVD) process, a preferred orientation in the z-axis direction allows the nano pores to form naturally a vertical columnar structure.

The nano pore can be produced when a deposition material for forming the thin film 920 reaches the substrate 900 and when a surface diffusion does not occur. That is, when the deposition material reaches the substrate 900 and the temperature of the substrate 900 is low (i.e., a normal temperature), the deposition material is not stabilized and immediately grows to have a columnar structure. Therefore, in the case where the deposition material is deposited by use of a sputtering deposition method, a thermal evaporation method or an electron beam evaporation method, the nano pores are formed to have a columnar structure by depositing the material at a normal temperature instead of heating the substrate 900.

In the nano pore, it is possible to adjust porosity of the pore as well as an angle at which the pore is formed due to the atomic shadowing effect according to an incident flux angle at which the deposition material is deposited.

Depositing a Nano Wire Material

Figure 13:
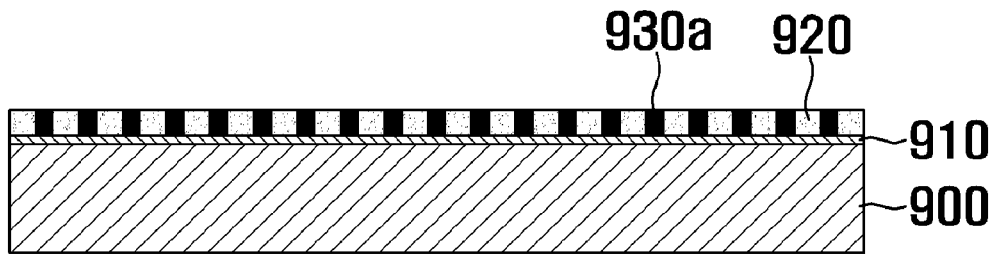

As shown in FIG. 13, a nano wire material 930a is deposited between the nano pores of the thin film 920 formed on the metal catalyst material layer 910, and then the deposited nano wire material 930a is vertically grown. Here, the nano wire material 930a may correspond to a carbon nano tube. The carbon nano tube 930a can be deposited by using the chemical vapor deposition.

Figure 14:
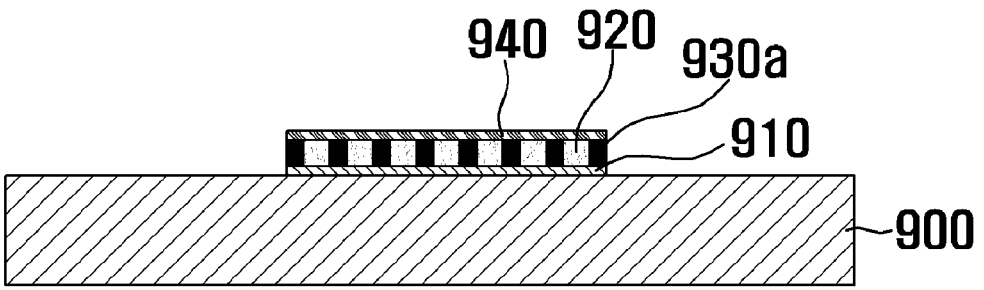

Next, as shown in FIG. 14, after a photo sensitizer 940 is applied on the thin film 920 and the carbon nano tube 930a, the thin film 920 and the carbon nano tube 930a are patterned by using the wet etching method, and then the photo sensitizer 940 is removed.

Forming a Nano Wire

Figure 15:
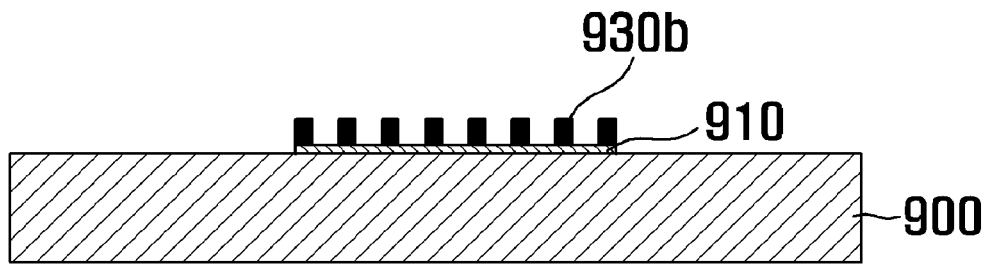

As shown in FIG. 15, the thin film 920 is removed through the dry etching method or the wet etching method such that the carbon nano wire 930b is formed.

According to the embodiment, it is possible to omit a process of forming a nano-sized mold by using a thin film 920 having columnar nano pores formed therein as a mold for forming a nano wire 930b or a nano structure.

[A Method for Forming a Hydrophobic Surface]

Figure 16:
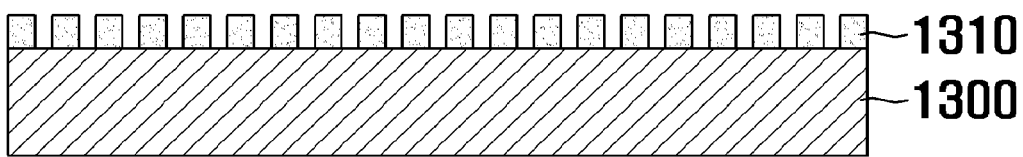
FIGS. 16 to 18 show a method for forming a hydrophobic surface according to an embodiment of the present invention.
Figure 17:
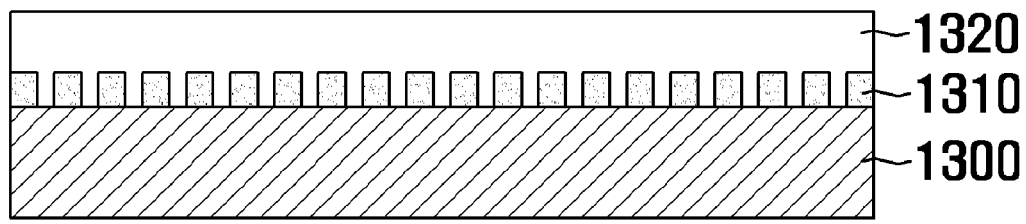
Figure 18:

FIGS. 16 to 18 show a method for forming a hydrophobic surface according to an embodiment of the present invention.

Referring to FIGS. 16 to 18, a method for forming a hydrophobic surface according to the present invention includes forming a thin film, a coating treatment, a polymer application and forming a hydrophobic surface.

Forming a Thin Film

As shown in FIG. 16, a thin film 1310 is formed on a substrate 1300. The thin film 1310 includes vertical nano pores formed therein. The nano pores have a vertical columnar structure.

The thin film 1310 is formed of a metallic material, an oxide, a nitride and a fluoride by applying a physical vapor deposition or a chemical vapor deposition. Here, metallic materials such as Ni, Cr, Co, Fe, Ti, Pt and Al and the like are used for forming the thin film 1310. An oxide such as indium tin oxide (ITO), ZnO, SiO and $TiO_2$ is used as a material of the thin film 1310. A nitride such as TiN, CrN and NbN is used as a material of the thin film 1310. Moreover, $CaF_2$ and $MgF_2$ are also used for forming the thin film 1310.

The physical vapor deposition (PVD) process for forming the thin film 1310 includes a sputtering deposition method, a thermal evaporation method or an electron beam evaporation method. The chemical vapor deposition (CVD) process includes APCVD, LPCVD or PECVD.

When aforementioned metallic material, oxide, nitride or fluoride is deposited by the physical vapor deposition (PVD) process such as a sputtering deposition or a thermal evaporation, the thin film 1310 including the nano pores is formed. A limited surface diffusion and an atomic shadowing effect obtained by not heating the substrate allow the nano pores to form naturally a vertical columnar structure.

When aforementioned metallic material, oxide, nitride or fluoride is deposited by increasing a deposition temperature through the chemical vapor deposition (CVD) process, a preferred orientation in the z-axis direction allows the nano pores to form naturally a vertical columnar structure.

The nano pore can be produced when a deposition material for forming the thin film 1310 reaches the substrate 1300 and when a surface diffusion does not occur. That is, when the deposition material reaches the substrate 1300 and the temperature of the substrate 1300 is low (i.e., a normal temperature), the deposition material is not stabilized and immediately grows to have a columnar structure. Therefore, in the case where the deposition material is deposited by use of a sputtering deposition method, a thermal evaporation method or an electron beam evaporation method, the nano pores are formed to have a columnar structure by depositing the material at a normal temperature instead of heating the substrate 1300.

In the nano pore, it is possible to adjust porosity of the pore as well as an angle at which the pore is formed due to the atomic shadowing effect according to an incident flux angle at which the deposition material is deposited.

A Coating Treatment

After the thin film 1310 is formed, the thin film 1310 is caused to have a hydrophilic property in order to apply a polymer 1320. In other words, when the constituent material of the thin film 1310 is hydrophobic, a self-assembled monolayer (SAM) coating treatment is performed on the surface of the thin film 1310, so that the thin film 1310 becomes hydrophilic.

A Polymer Application

As shown in FIG. 17, the polymer 1320 is applied on the thin film 1310 such that the polymer 1320 is fully introduced into the nano pores formed in the thin film 1310. A method for applying the polymer 1320 includes a method for performing a spin coating process on the polymer inside a vacuum chamber and for stabilizing the polymer for a certain time such that the polymer 1320 is fully introduced into the nano pores formed in the thin film 1310 by removing the bubbles between the thin film 1310 and the polymer 1320.

Forming a Hydrophobic Surface

The polymer 1320 is separated from the thin film 1310 so that the polymer 1320 comes to have a hydrophobic surface. A method for separating the polymer 1320 from the thin film 1310 includes a method for mechanically taking off the polymer 1320 from the thin film 1310 and a method for removing the thin film 1310.

A nano-sized structure obtained from a copy of the columnar structure of the nano pore is formed on the surface of the polymer 1320 separated from the thin film 1310 through such methods. The surface of the polymer 1320 becomes hydrophobic due to the nano structure.

According to the embodiment, through the method for forming a hydrophobic surface of the embodiment, it is possible to more easily manufacture the hydrophobic surface at a low cost by using a thin film having columnar nano pores formed therein without the use of expensive processes such as the photolithography, an electron beam photolithography or a nano imprint and the like.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

The invention claimed is:

1. A method for packaging a micro electro mechanical system (MEMS) device or a nano electro mechanical system (NEMS) device, the method comprising:
   forming a sacrificial layer on a substrate having a device formed thereon such that the device is covered with the sacrificial layer;
   forming a thin film having columnar nano pores formed therein by depositing a deposition material selected from the group consisting of a metallic material, an oxide, a nitride and a fluoride on the sacrificial layer, wherein the nano pores are naturally formed during said deposition;

removing the sacrificial layer through use of the nano pores of the thin film; and forming a shielding layer on the thin film.

2. The method of claim 1, further comprising, after forming the thin film, forming a support layer on the thin film and patterning the support layer such that parts of the thin film are exposed, and wherein the sacrificial layer is removed using parts of which are exposed by patterning the support layer.

3. The method of claim 2, wherein the support layer and the shielding layer comprise at least one of a silicon oxide, a silicon nitride and a silicon carbide.

4. The method of claim 2, wherein the shielding layer is formed by a polymeric material comprising at least one of benzocyclobutene (BCB) and polyimide, and wherein the forming the shielding layer comprises a coating the thin film and the support layer with the polymeric material under a desired atmosphere; and performing a heat treatment process on the coated polymer material.

5. The method of claim 1, wherein the forming the thin film uses one of a physical vapor deposition (PVD) method and a chemical vapor deposition (CVD) method.

6. The method of claim 5, wherein the physical vapor deposition method comprises one of a sputtering deposition method, a thermal evaporation method or an electron beam evaporation method.

7. The method of claim 5, wherein the chemical vapor deposition method comprises one of atmosphere CVD (APCVD), low-pressure CVD (LPCVD) and plasma-enhanced CVD (PECVD).

8. The method of claim 1, wherein the metallic material comprises at least one of Ni, Cr, Co, Fe, Ti, Pt and Al, wherein the oxide comprises at least one of indium tin oxide (ITO), ZnO, SiO and $TiO_2$, wherein the nitride comprises at least one of TiN, CrN and NbN and wherein the fluoride comprises at least one of $CaF_2$ and $MgF_2$.

9. The method of claim 1, wherein the thin film is formed by depositing the deposition material without heating the substrate.

10. The method of claim 9, wherein the substrate is at ambient temperature during the deposition.

11. The method of claim 9, wherein when the deposition material reaches the substrate, the deposition material is not stabilized and immediately grows to have a columnar structure including the columnar nano pores.

* * * * *